(12) United States Patent
Campbell

(10) Patent No.: US 7,250,663 B2
(45) Date of Patent: *Jul. 31, 2007

(54) FRAME SCALE PACKAGE USING CONTACT LINES THROUGH THE ELEMENTS

(75) Inventor: Scott Patrick Campbell, Thousand Oaks, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/135,558

(22) Filed: May 24, 2005

(65) Prior Publication Data

US 2005/0285265 A1 Dec. 29, 2005

Related U.S. Application Data

(62) Division of application No. 10/003,821, filed on Oct. 31, 2001, now Pat. No. 7,012,315.

(60) Provisional application No. 60/245,085, filed on Nov. 1, 2000.

(51) Int. Cl.
H01L 31/0203 (2006.01)

(52) U.S. Cl. ..................................................... 257/433

(58) Field of Classification Search ................ 257/433, 257/434
See application file for complete search history.

(56) References Cited

U.S. PATENT DOCUMENTS

| | | | |
|---|---|---|---|
| 4,761,518 A * | 8/1988 | Butt et al. ................ | 174/52.4 |
| 5,291,038 A * | 3/1994 | Hanamoto et al. ............ | 257/82 |
| 5,302,852 A | 4/1994 | Kaneda et al. | |
| 5,477,081 A | 12/1995 | Nagayoshi | |
| 5,821,457 A | 10/1998 | Mosley et al. | |
| 5,821,532 A | 10/1998 | Beaman et al. | |
| 6,297,540 B1 | 10/2001 | Assadi et al. | |
| 6,313,525 B1 | 11/2001 | Sasano | |
| 6,403,881 B1 | 6/2002 | Hughes | |
| 6,404,648 B1 * | 6/2002 | Slupe et al. ................ | 361/760 |
| 6,437,412 B1 | 8/2002 | Higuchi et al. | |
| 6,455,925 B1 | 9/2002 | Laureanti | |
| 6,475,824 B1 | 11/2002 | Kim | |
| 6,489,670 B1 | 12/2002 | Peterson et al. | |
| 6,495,895 B1 | 12/2002 | Peterson et al. | |
| 6,645,783 B1 | 11/2003 | Brunner et al. | |
| 6,674,159 B1 * | 1/2004 | Peterson et al. ............ | 257/680 |
| 6,696,738 B1 * | 2/2004 | Tu et al. ..................... | 257/433 |
| 6,707,125 B2 * | 3/2004 | Harazono .................... | 257/434 |
| 6,774,447 B2 | 8/2004 | Kondo et al. | |

(Continued)

FOREIGN PATENT DOCUMENTS

JP 406151977 A 5/1994

*Primary Examiner*—David A. Zarneke
(74) *Attorney, Agent, or Firm*—Dickstein Shapiro LLP

(57) ABSTRACT

A package for an integrated circuit contacting device which is shaped like a frame. A portion of the contacting device may be bonded to the printed circuit board, and includes leads which extend along in outer surface thereof, from an outside edge of the package to a downward facing surface of the package which faces an integrated circuit die. The package may be in dented in the shape of the die, and may also include indentations allowing a lid and/or a back portion to be located thereon. In an embodiment, a lens amounts may also be used.

42 Claims, 3 Drawing Sheets

U.S. PATENT DOCUMENTS 6,779,497 B2 * 8/2004 Maisch .................... 123/90.16
7,012,315 B1 * 3/2006 Campbell ................... 257/433
7,112,471 B2 * 9/2006 Boon et al. ................. 438/116
2004/0212055 A1 * 10/2004 Exposito et al. ............ 257/678

* cited by examiner

FRAME SCALE PACKAGE USING CONTACT LINES THROUGH THE ELEMENTS

CROSS-REFERENCE TO RELATED APPLICATIONS

This application is a divisional of application Ser. No. 10/003,821, filed Oct. 31, 2001, now U.S. Pat. No. 7,012,315 issued Mar. 14, 2006, which claims priority from provisional application No. 60/245,085, filed Nov. 1, 2000, the subject matter of both are herein incorporated by reference in their entirety.

BACKGROUND

Many different systems are known for packaging integrated circuits. Standard packages come by many different names. However, many of these packages have the same object: to package an active part of an integrated circuit, a "die", in a way that protects the die, but also allows electrical communication to and from the die.

SUMMARY

The present application teaches a frame scale package which may hold the die around its edges and effectively frames the die. The system may have significant advantages, including better protection of the die against the environment.

BRIEF DESCRIPTION OF THE DRAWINGS

These and other aspects will now be described in detail with respect to the accompanying drawings wherein.

DETAILED DESCRIPTION

Figure 1A:
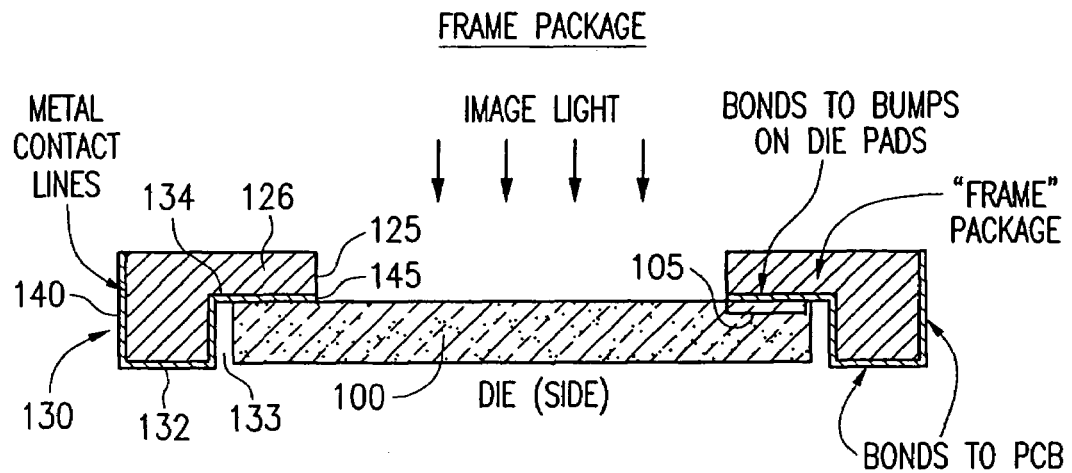
FIGS. 1A and 1B show respective side and top views of a first embodiment of a basic frame package for an image sensor.
Figure 1B:
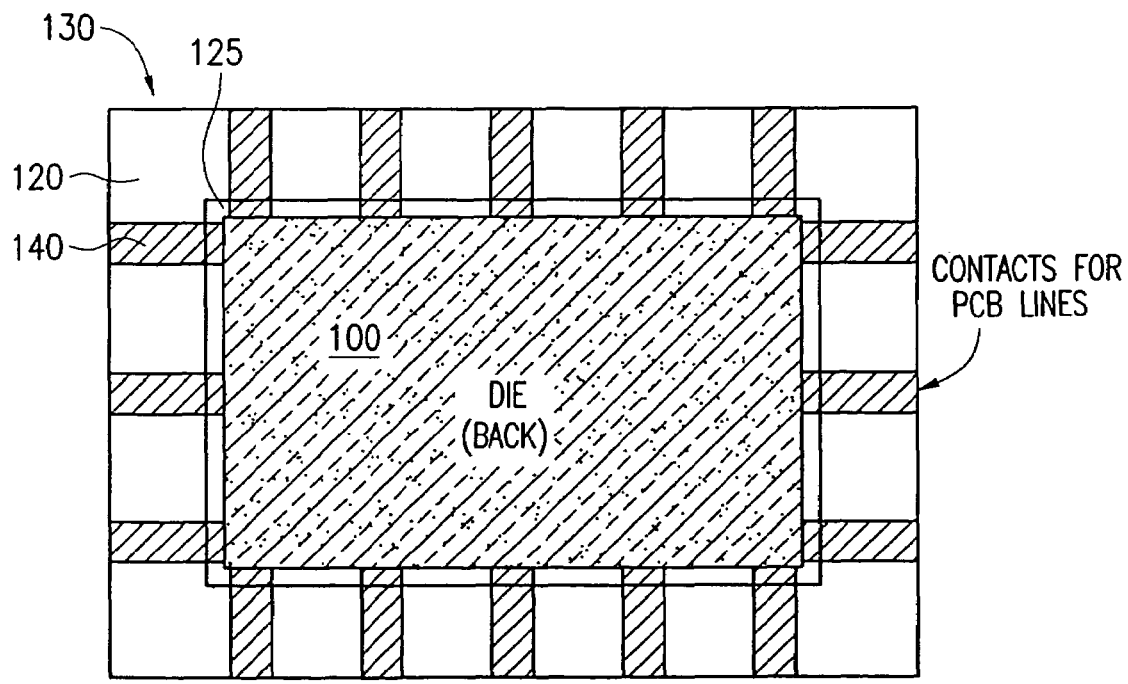

FIGS. 1A and 1B show a first embodiment of the frame scale package. FIG. 1a shows the side view, showing the die element 100, which is an integrated circuit with an image sensor element integrated thereon. Preferably, the image sensor element is an active pixel sensor, of the type described in U.S. Pat. No. 5,471,215. As conventional, the die 100 includes contact portions 105 along an outer edge thereof, which enable electrical connection to the circuitry on the die. Electrical connection includes connections for power and signals.

The frame package is formed by an outer package element 120 which has an inner perimeter area 125 that is "stepped", which is to say that it has a first portion 126 which is slightly smaller than the die outer perimeter, and a thinned portion, where the thickness is reduced so that it can connect to the outer edges of the die. The outer perimeter 130 has a greater thickness than the inner perimeter, again with the difference in thicknesses being sufficient to accommodate the thickness of the die.

The outer surface of the frame includes a plurality of metal contact lines 140. The metal contact lines 140 may extend, as shown in FIG. 1A and FIG. 1B, from the outer perimeter 130 of the frame, along the bottom surface of the frame 132, along the step portion 133 of the inner perimeter of the frame, and along the bottom surface 134 of the inner portion of the frame. A connection 145 to the die 100 may be made at the location where the contact extends along the inner portion of the frame. The outer perimeter 140 also has a metal contact line, enabling a contact to be made at that frame package location.

The frame package may also be bonded to the printed circuit board along either or both of the surfaces 130,132.

FIG. 1B shows how a plurality of contact areas for the printed circuit board lines may be provided. While the figure shows only a few contacts being made, of course there may be many more contacts.

In operation, the frame package forms a structure like a frame around the rectangular die. The bond pads on the die may contact the leads on the package via direct soldering rather than wire bonding, analogous to the way that connections are carried out in flip chip bonded die mounting. The leads in the frame scale package may also be soldered directly to a printed circuit board.

In FIGS. 1A and 1B, an image sensor die 100 is placed face up into the package, and may fit snugly inside the inner perimeter of the package as shown. Since the package forms a frame around the die, portions of the package may contact the die at its outer edges. The die is prepared with solder bumps located on its bonded tabs in the areas 105.

Once the package is placed around the die, the system is heated to melt the solder bumps. This thereby bonds the die to the frame package leads. The leads of the package run from the die contacts, along the area on the underside of the package, and may also run out along the outer perimeter of the package for lead bonding to the printed circuit board.

Figure 2:
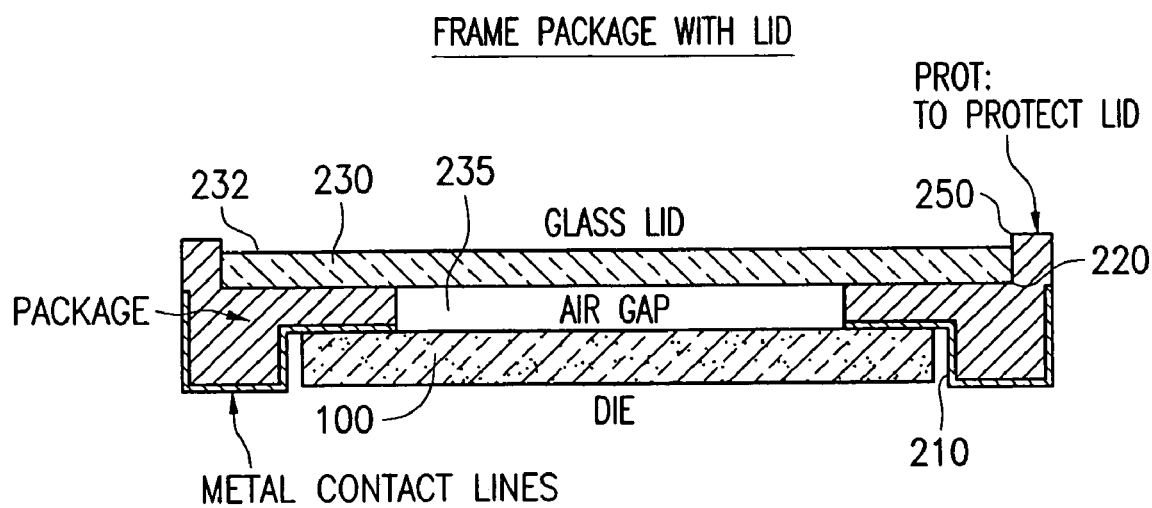
FIG. 2 shows a frame package side view with a lid.

Other embodiments may provide other structures that associate with and protect or work with the die. The FIG. 2 embodiment includes a similar package which includes flanges on the frame package; not only at its bottom portion 210, but also at the top portion 220. The top frame 220 may receive a glass lid 230 which is separated from the die 100 by an air gap shown as 235. A protuberance 250 is a spot where the frame scale package extends above the level of the lid. This may be done to prevent the operative optical surface 232 of the lid from being scratched. The glass lid may be bonded to the lid in conventional ways, such as with a silicon sealant.

Figure 3:
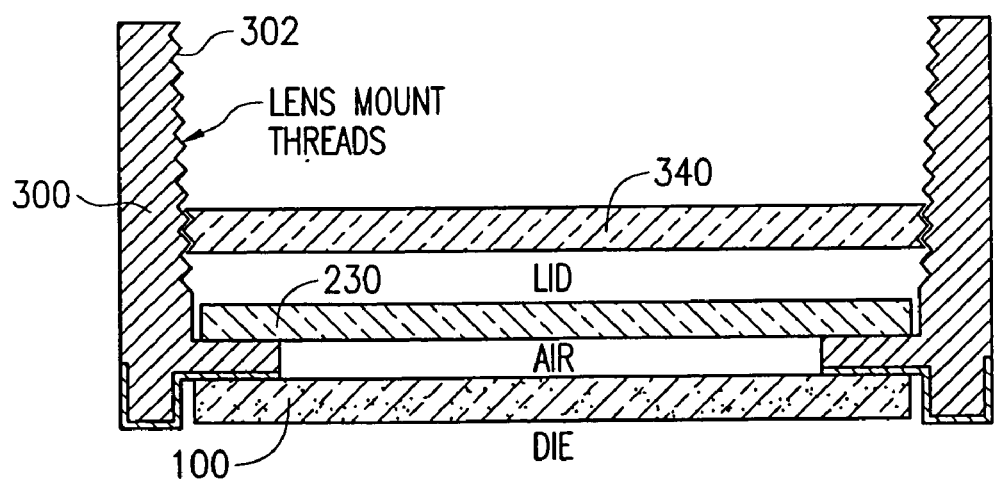
FIG. 3 shows a frame package with lid and having a lens mount.

FIG. 3 shows an alternative frame package which includes an additional threaded area 300 above the die 100 and glass lid 230. The additional area 300 has inner threads, which are threaded to accept a lens 340. In this way, a lens may be mounted within the package, associated with the die. For example, this may enable focusing of certain incoming rays to the die. While this embodiment shows the inner surfaces as being threaded, it should be understood that other surface features could be used alternatively to hold the lens 340 in place.

Figure 4:
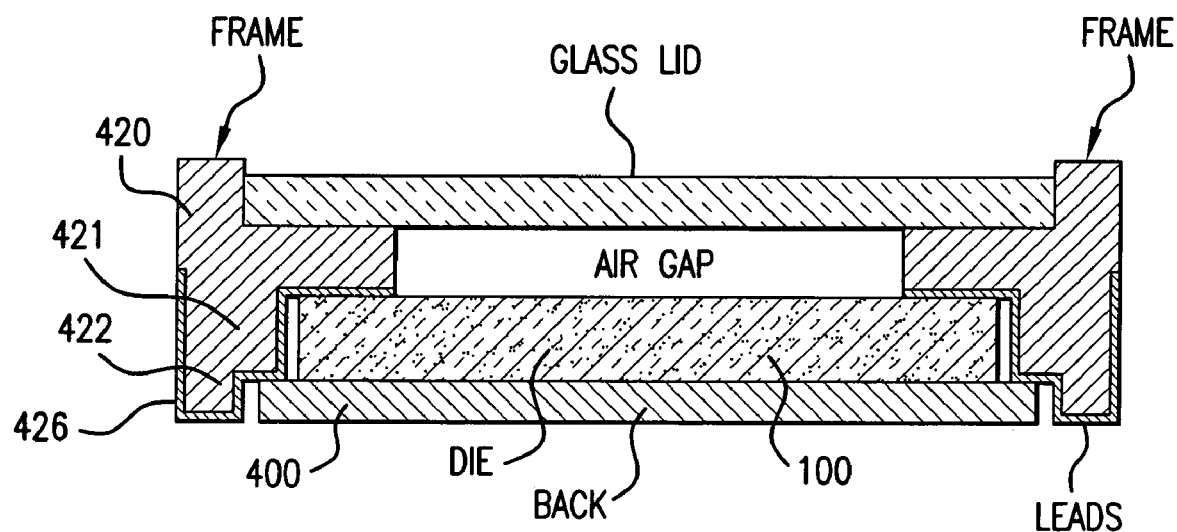
FIG. 4 shows a totally sealed frame scale package with a lead and rear portion.

FIG. 4 shows an alternative embodiment in which the frame scale package includes multiple indentations, one of which forms a backing portion for the die. The backing portion 400 is located behind the die 100. In this embodiment, the frame 420 includes a first indentation portion 422 which is sized to accept the backing portion 400. The second indentation portion 424 is sized to accept the die 100. The leads 426 are similar to those in the previous embodiment, but in addition, may travel along the two indented portions 422,424. The back plate may allow better sealing of the die against the environment.

Although only a few embodiments have been disclosed in detail above, other modifications are possible. All such modifications are intended to be encompassed within the following claims.

What is claimed is:

1. A support device for an integrated circuit comprising:
a frame member, said frame member having:
a first lateral surface with a first aperture therein;
a second lateral surface disposed in substantially parallel spaced relation to said first lateral surface, said second lateral surface being disposed within said first aperture so as to form a recessed region within said first aperture, said second lateral surface having a second aperture disposed therein, said second aperture being adapted to receive light therethrough; and
an electrical conductor mutually supported by said first lateral surface and said second lateral surface, said electrical conductor being adapted to be coupled to an integrated circuit within said recessed region.

2. A support device for an integrated circuit as defined in claim 1 wherein said integrated circuit comprises a photosensitive device adapted to receive said light.

3. A support device for an integrated circuit as defined in claim 1 further comprising a first medial surface, said first medial surface being disposed between said first and second lateral surfaces and coupling said first and second lateral surfaces within said first aperture.

4. A support device for an integrated circuit as defined in claim 3 wherein said first medial surface is mutually disposed in substantially perpendicular relation to said first and second lateral surfaces respectively.

5. A support device for an integrated circuit as defined in claim 3 wherein said electrical conductor is further supported by said first medial surface.

6. A support device for an integrated circuit as defined in claim 1 wherein said first aperture defines a substantially rectangular perimeter.

7. A support device for an integrated circuit as defined in claim 1 wherein said second aperture defines a substantially rectangular perimeter.

8. A support device for an integrated circuit as defined in claim 1 wherein said electrical conductor is adapted to be coupled to said integrated circuit by a eutectic solder.

9. A support device for an integrated circuit as defined in claim 1 wherein said electrical conductor is adapted to be coupled to said integrated circuit by a wire bond.

10. A support device for an integrated circuit as defined in claim 3 wherein
said first aperture defines a first inner perimeter of said first lateral surface and wherein said first lateral surface includes a second outer perimeter; said frame member further including a third lateral surface disposed in substantially parallel spaced relation to said first lateral surface, said third lateral surface including a third outer perimeter; and
a second medial surface disposed between said first lateral surface and said third lateral surface at said second and third perimeters respectively.

11. A support device for an integrated circuit as defined in claim 10 wherein said second medial surface is disposed in substantially perpendicular relation to said first and third lateral surfaces respectively.

12. A support device for an integrated circuit as defined in claim 11 wherein said electrical conductor is further supported by said second medial surface.

13. A support device for an integrated circuit as defined in claim 10 further comprising a lid member, said lid member having a lid surface.

14. A support device for an integrated circuit as defined in claim 13 wherein said first lateral surface is adapted to support said lid surface.

15. A support device for an integrated circuit as defined in claim 13 wherein said lid member is adapted to be hermetically sealed to said frame member.

16. A support device for an integrated circuit as defined in claim 10 further comprising a lens mount portion said lens mount portion being disposed proximal to said third lateral surface.

17. A support device for an integrated circuit as defined in claim 16 wherein said lens mount portion comprises a lens support feature.

18. A support device for an integrated circuit as defined in claim 17 wherein said lens support feature comprises a helical thread.

19. A support device for an integrated circuit as defined in claim 17 wherein said lens support feature is adapted to allow repositioning of a lens, whereby said light may be focused through said lens on a photosensitive surface of said integrated circuit.

20. A support device for an integrated circuit as defined in claim 10 wherein a perimeter of said integrated circuit is disposed substantially coincident with said first inner perimeter.

21. A support device for an integrated circuit comprising:
a frame member, said frame member having:
a first lateral surface with a first aperture therein;
a second lateral surface disposed in substantially parallel spaced relation to said first lateral surface, said second lateral surface having a second aperture therein, said second lateral surface being disposed within said first aperture so as to form a first recessed region within said first aperture;
a third lateral surface disposed in substantially parallel spaced relation to said first and second lateral surfaces, said third lateral surface being disposed within said second aperture so as to form a second recessed region within said second aperture, said third lateral surface having a third aperture therein, said third aperture being adapted to receive light therethrough; and
an electrical conductor mutually supported by said first, second and third lateral surfaces said electrical conductor being adapted to be coupled to an integrated circuit within said second recessed region.

22. A support device for an integrated circuit as defined in claim 21 further comprising a back member disposed within said first recessed region.

23. A support device for an integrated circuit as defined in claim 22 wherein said back member is hermetically sealed to said frame member.

24. A support device for an integrated circuit as defined in claim 21 wherein said integrated circuit comprises a photosensitive device adapted to receive said light.

25. A support device for an integrated circuit as defined in claim 21 further comprising a first medial surface, said first medial surface being disposed between said second and third lateral surfaces and coupling said second and third lateral surfaces within said second aperture.

26. A support device for an integrated circuit as defined in claim 25 wherein said first medial surface is mutually disposed in substantially perpendicular relation to said second and third lateral surfaces respectively.

27. A support device for an integrated circuit as defined in claim 25 wherein said electrical conductor is further supported by said second medial surface.

28. A support device for an integrated circuit as defined in claim 21 wherein said second aperture defines a substantially rectangular perimeter.

29. A support device for an integrated circuit as defined in claim 21 wherein said third aperture defines a substantially rectangular perimeter.

30. A support device for an integrated circuit as defined in claim 21 wherein said electrical conductor is adapted to be coupled to said integrated circuit by a eutectic solder.

31. A support device for an integrated circuit as defined in claim 21 wherein said electrical conductor is adapted to be coupled to said integrated circuit by a wire bond.

32. A support device for an integrated circuit as defined in claim 25 wherein
    said first aperture defines a first inner perimeter of said first lateral surface and wherein said first lateral surface includes a second outer perimeter; said frame member further including a fourth lateral surface disposed in substantially parallel spaced relation to said first lateral surface, said fourth lateral surface including a third outer perimeter; and
    a second medial surface disposed between said first lateral surface and said third lateral surface at said second and third perimeters respectively.

33. A support device for an integrated circuit as defined in claim 32 wherein said second medial surface is disposed in substantially perpendicular relation to said first and fourth lateral surfaces respectively.

34. A support device for an integrated circuit as defined in claim 33 wherein said electrical conductor is further supported by said second medial surface.

35. A support device for an integrated circuit as defined in claim 32 further comprising a lid member, said lid member having a lid surface.

36. A support device for an integrated circuit as defined in claim 35 wherein said second lateral surface is adapted to support said lid surface.

37. A support device for an integrated circuit as defined in claim 35 wherein said lid member is adapted to be hermetically sealed to said frame member.

38. A support device for an integrated circuit as defined in claim 35 further comprising a lens mount portion said lens mount portion being disposed proximal to said fourth lateral surface.

39. A support device for an integrated circuit as defined in claim 38 wherein said lens mount portion comprises a lens support feature.

40. A support device for an integrated circuit as defined in claim 2 wherein said lens support feature comprises a helical thread.

41. A support device for an integrated circuit as defined in claim 2 wherein said lens support feature is adapted to allow repositioning of a lens, whereby said light may be focused through said lens on a photosensitive surface of said integrated circuit.

42. A support device for an integrated circuit as defined in claim 21 wherein said second aperture defines a fourth inner perimeter and wherein a perimeter of said integrated circuit is adapted to be disposed substantially coincident with said fourth inner perimeter.

* * * * *